(12) United States Patent
Huang

(10) Patent No.: US 12,007,813 B2
(45) Date of Patent: *Jun. 11, 2024

(54) SEMICONDUCTOR DEVICE FOR ATTACHING TO A FLEXIBLE DISPLAY

(71) Applicant: TAIWAN SEMICONDUCTOR MANUFACTURING COMPANY LTD., Hsinchu (TW)

(72) Inventor: Cheng-Hao Huang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/193,624

(22) Filed: Mar. 30, 2023

(65) Prior Publication Data

US 2023/0236636 A1 Jul. 27, 2023

Related U.S. Application Data

(60) Continuation of application No. 17/235,235, filed on Apr. 20, 2021, now Pat. No. 11,619,974, which is a
(Continued)

(51) Int. Cl.
*G06F 1/16* (2006.01)
*G09F 9/30* (2006.01)
(Continued)

(52) U.S. Cl.
CPC ............ *G06F 1/1652* (2013.01); *G09F 9/301* (2013.01); *H01L 21/822* (2013.01); *H10K 50/84* (2023.02);
(Continued)

(58) Field of Classification Search
CPC ..... G06F 1/1652; G09F 9/301; H01L 21/822; H01L 24/05; H01L 24/06; H01L 24/81; H01L 27/124; H10K 50/84; H10K 71/00; H10K 77/111; H10K 59/131; H10K 2102/311; G02F 1/13458; Y02E 10/549; Y02P 70/50
See application file for complete search history.

(56) References Cited

U.S. PATENT DOCUMENTS 11,023,011 B2* 6/2021 Huang ................ H01L 21/822
2015/0017778 A1* 1/2015 Tsai ........................ H01L 24/11
438/381

* cited by examiner

*Primary Examiner* — Patricia D Valenzuela
(74) *Attorney, Agent, or Firm* — WPAT LAW; Anthony King

(57) ABSTRACT

A semiconductor device includes a substrate, conductive features on the substrate, and a passivation layer over the conductive features to define conductive pads in the respective conductive features through exposed portions of each of the conductive features. Each corner of the conductive pads is free of right angle, the substrate has a pair of long sides from a top view perspective, the shape of each of the conductive pads is a parallelogram. Each of the conductive pads has a pair of long sides and a pair of short sides from a top view perspective, a portion of the conductive pads have the long sides sloped away from a first pad density area of the substrate and toward one long side of the substrate, and the rest of the conductive pads have the long sides sloped toward the first pad density area and toward the other long side of the substrate.

20 Claims, 17 Drawing Sheets

Related U.S. Application Data division of application No. 16/368,855, filed on Mar. 29, 2019, now Pat. No. 11,023,011.

(60) Provisional application No. 62/738,423, filed on Sep. 28, 2018.

(51) Int. Cl.
| | |
|---|---|
| *H01L 21/822* | (2006.01) |
| *H10K 50/84* | (2023.01) |
| *H10K 71/00* | (2023.01) |
| *H10K 77/10* | (2023.01) |
| G02F 1/1345 | (2006.01) |
| H01L 23/00 | (2006.01) |
| H01L 27/12 | (2006.01) |
| H10K 59/131 | (2023.01) |

(52) U.S. Cl.
CPC ............ *H10K 71/00* (2023.02); *H10K 77/111* (2023.02); *G02F 1/13458* (2013.01); *H01L 24/05* (2013.01); *H01L 24/06* (2013.01); *H01L 24/81* (2013.01); *H01L 27/124* (2013.01); *H10K 59/131* (2023.02)

SEMICONDUCTOR DEVICE FOR ATTACHING TO A FLEXIBLE DISPLAY

PRIORITY CLAIM AND CROSS-REFERENCE

This application is a continuation application of U.S. patent application Ser. No. 17/235,235, filed Apr. 20, 2021, which claims priority to U.S. application Ser. No. 16/368,855, filed Mar. 29, 2019, and U.S. Provisional Application No. 62/738,423, filed on 28 Sep. 2018.

BACKGROUND

A flexible display provides increased convenience due to portability and increased screen size, and can be applied to mobile devices, such as cellular phones, portable multimedia players (PMPs), navigation devices, ultra mobile personal computers (UMPCs), e-books and e-newspapers, and also to other fields, such as TVs, monitors, and the like.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
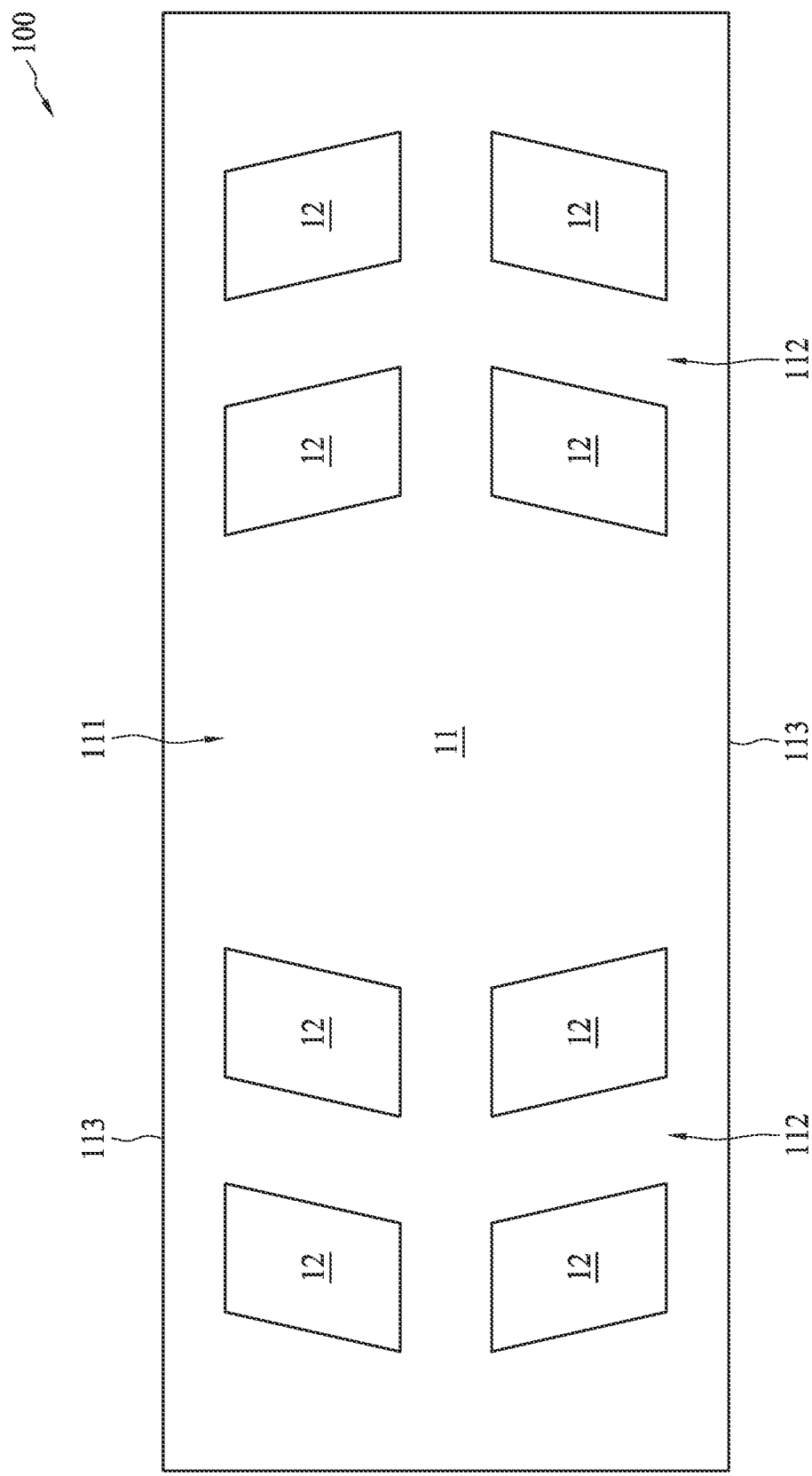
FIG. 1 is a top schematic view of a semiconductor device in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation.

In a manufacturing process of a flexible display device, a semiconductor device, such as a driver IC, may be physically bonded or attached to the flexible display. The flexible display may be a flexible display panel (e.g., an organic light-emitting diode (OLED) panel), a flexible printed circuit board (FPCB), or a plastic transparent liquid-crystal display (LCD) panel.

However, when bonding the semiconductor device to the flexible display, cracks or other mechanical defects such as debonding of existing layers in the semiconductor device may occur. Over time, even small cracks along the edge of the conductive pad of the semiconductor device can propagate towards deeper regions of the device. Cracks and other defects generated in this way that encroach into a deeper region can allow moisture to permeate into the semiconductor device, which reduces the reliability of the semiconductor device.

Integrated circuit (IC) devices are usually fabricated on semiconductor wafers having a plurality of IC device dies. Each IC includes conductive pads on its top surface that connect to various nodes in the device, such as for signal input, signal output and power supply nodes. The conductive pads of an IC are generally connected by a wire of a lead frame or other electrically conductive structure such as a contact pad on a support in order for a printed circuit board (PCB) to permit utilization of the IC die. Known methods for connecting an IC device to a lead frame or other support elements include wire bonding, tape automated bonding (TAB), controlled collapse chip connection (C4) or bump bonding, and electrically conductive adhesives.

Conventionally, a conductive pad disposed on a substrate includes four right angle from the top view perspective. That is, the shape of the conductive pad is square or rectangular from the top view perspective. When the semiconductor device is being bonded to the flexible display by applying a predetermined pressure, the semiconductor device may easily crack, especially the region around the conductive pad. The reason for this phenomenon is that the region around the right angle of the square or rectangular conductive pad is the area being subjected to the most stress.

The present disclosure therefore provides a semiconductor device for attaching to a flexible display, a flexible display, and a method of manufacturing a flexible display. The semiconductor device for attaching to a flexible display includes a substrate including semiconductive material, and a conductive pad disposed on the substrate. Each corner of the conductive pad is free of right angle.

FIG. 1 is a top schematic view illustrating a semiconductor device for attaching to a flexible display according to aspects of the present disclosure in some embodiments. Referring to FIG. 1, a semiconductor device 100 for attaching to a flexible display includes a substrate 11 including semiconductive material, and a conductive pad 12 disposed on the substrate. Each corner of the conductive pad 12 is free of right angle. In some embodiments, the semiconductor device 100 is a driver IC for a display. In some embodiments, the semiconductor device 100 includes a plurality of conductive pads 12. The number of the conductive pads 12 has no particular limits, and the conductive pads 12 can be arranged depending on the geometrical design and dimensions of the semiconductor device 100.

In order to avoid right angle from a top view perspective of the semiconductor device 100, in some embodiments, the conductive pad 12 is arc-shaped from a top view perspective. The geometrical design and dimensions of the conductive pad 12 have no particular limits, and can be, but need not necessarily be, round, oval, rectangular, square, triangle, quadrilateral, parallelogram, diamond, trapezoidal, pentagonal, hexagon, or other desired shape, as long as each corner of the conductive pad 12 is free of right angle, or is a rounded corner. In some embodiments, the shape of each conductive pad 12 may be the same or different. In some embodiments, the conductive pads 12 have similar features. While the conductive pads 12 are described as having similar features, such description is intended to be illustrative and is not intended to limit the embodiments, as the conductive pads 12 may have similar structures or different structures in order to meet the desired functional requirements. In some embodiments, the shape of the conductive pad 12 is a parallelogram or trapezoid from a top view perspective.

In some embodiments, the substrate 11 includes a low pad density area 111. In some embodiments, when the semiconductor device is being bonded to the flexible display or any other device by applying a predetermined pressure, the predetermined pressure can be applied to the low pad density area 111. In some embodiments, the low pad density area 111 is located at the center of the substrate 11. In some embodiments, the low pad density area 111 has no conductive pad 12.

In some embodiments, the substrate 11 further includes at least two high pad density areas 112, the conductive pad 12 density of each high pad density area 112 is higher than the conductive pad 12 density of the low pad density area 111. In some embodiments, the low pad density area 111 is located between the high pad density areas 112. In some embodiments, as shown in FIG. 1, the shape of the substrate 11 is rectangular, the low pad density area 111 is located at the center of the substrate 11, and two high pad density areas 112 are located at both ends of the long side 113 of the rectangular substrate 11.

In some embodiments, the shape of the conductive pad 12 is a parallelogram from a top view perspective and the conductive pad 12 is slanted away from the low pad density area 111. In some embodiments, the shape of the conductive pad 12 is a parallelogram from a top view perspective and the conductive pad 12 is slanted toward the low pad density area 111. In some embodiments, the shape of the conductive pad 12 is a parallelogram, and the parallelogram conductive pad 12 has a pair of long sides and a pair of short sides from a top view perspective. In some embodiments, the long sides of the parallelogram conductive pad 12 are sloped away from the low pad density area 111 and toward the long side 113 of the substrate 11. In some embodiments, the long sides of the parallelogram conductive pad 12 are sloped toward the low pad density area 111 and toward the long side 113 of the substrate 11. In some embodiments, the short sides of the parallelogram conductive pad 12 are parallel to the long side 113 of the substrate 11. In some embodiments, the short sides of the parallelogram conductive pad 12 are sloped away from the low pad density area 111 and toward the long side 113 of the substrate 11. In some embodiments, the short sides of the parallelogram conductive pad 12 are sloped toward the low pad density area 111 and toward the long side 113 of the substrate 11. In some embodiments, the long sides of the parallelogram conductive pad 12 are parallel to the long side 113 of the substrate 11. In some embodiments, the conductive pads 12 are arranged in similar configurations. In some embodiments, the conductive pads 12 are arranged in different configurations.

Figure 2:
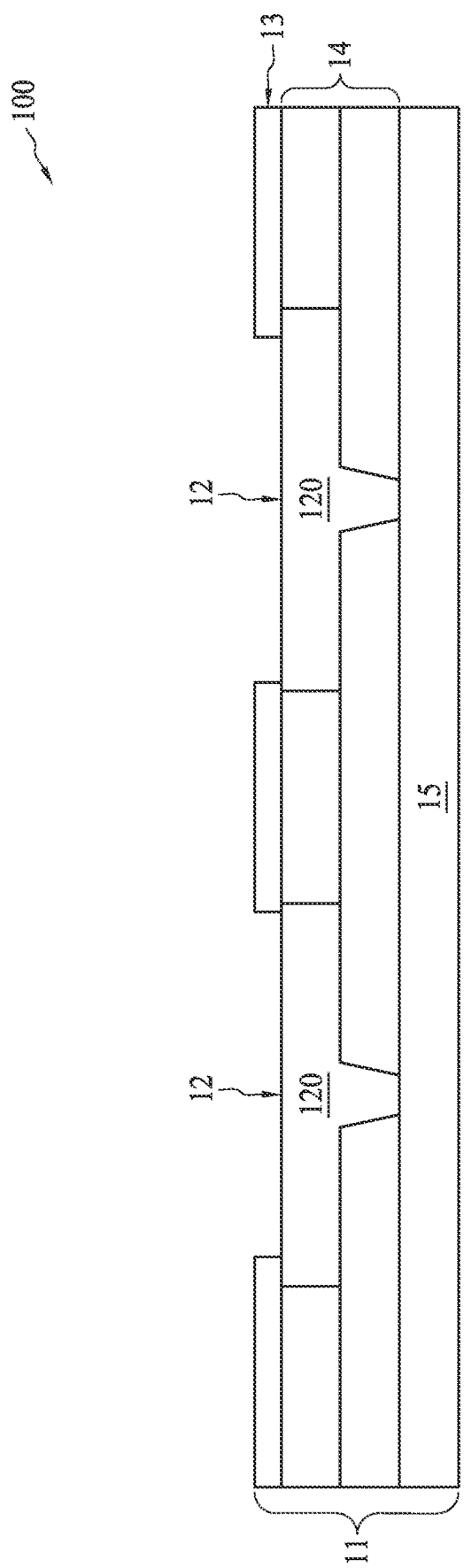
FIG. 2 is a cross-sectional view of a semiconductor device in accordance with some embodiments of the present disclosure.

FIG. 2 is a cross-sectional view of the semiconductor device for attaching to a flexible display according to aspects of the present disclosure in some embodiments. Referring to FIG. 2, in some embodiments, the semiconductive material included in the substrate 11 is selected from the group consisting of silicon, silicon-germanium, and other semiconductor materials including III-V or II-VI materials. In some embodiments, the substrate 11 includes at least one integrated circuit (IC) device formed thereon. In some embodiments, semiconductor device 100 includes a plurality of conductive features 120, wherein each conductive feature 120 includes a conductive pad 12.

In some embodiments, the substrate 11 further includes a passivation layer 13 surrounding the conductive pad 12. In some embodiments, the passivation layer 13 is disposed over the conductive features 120, and the passivation layer 13 is configured to provide a trench above each conductive feature 120 that defines the exposed portion of each conductive feature 120. In other words, the conductive pad 12 is the exposed portion of the corresponding conductive feature 120. In some embodiments, the conductive feature 120 includes copper, aluminum, or alloys thereof, a non-solderable pad material such as Ti metal, or a Ti compound material such as TiN, TiW, or TiAl3. In order to provide a reliable and low electrical resistance attachment surface of the conductive pad 12, in some embodiments, the conductive pad 12 is a multi-layered conductive pad having a top metal layer that is both electrically conductive and resistant to oxidation, in order to provide high reliability (good corrosion performance) and high performance (low resistance).

In some embodiments, the passivation layer 13 includes dielectric materials such as polyimide (PI), benzocyclobutene (BCB), polybenzoxazole (PBO), silicon nitride (SiN), silicon carbide (SiC), silicon oxide (SiO), silicon oxynitride (SiON), low-k dielectrics such as carbon doped oxides, extremely low-k dielectrics such as porous carbon doped silicon dioxide, or combinations thereof.

In some embodiments, the conductive pad 12 is an aluminum conductive pad. Solder bumping on aluminum is known to generally not be possible due to aluminum oxide formation during the soldering process, which prevents solder adhesion. In some embodiments, the conductive pad 12 is an aluminum conductive pad and includes a complex stack formed on the aluminum. In some embodiments, the complex stack includes a refractory-metal based barrier layer formed on the conductive pad, a copper seed formed on the barrier layer, an electroplated copper redirect layer (RDL), and an under bump metallization (UBM) formed on the RDL, wherein a solder bump (or ball) is formed on the UBM.

In some embodiments, the substrate 11 further includes a base layer 15, and an interlayer dielectric (ILD) layer 14 formed on the base layer 15. In some embodiments, the ILD layer 14 may include silicon oxide (SiO), silicon nitride (SiN), silicon oxynitride (SiON), silicon carbide (SiC), a low-dielectric constant dielectric material, or combinations thereof.

Figure 3:
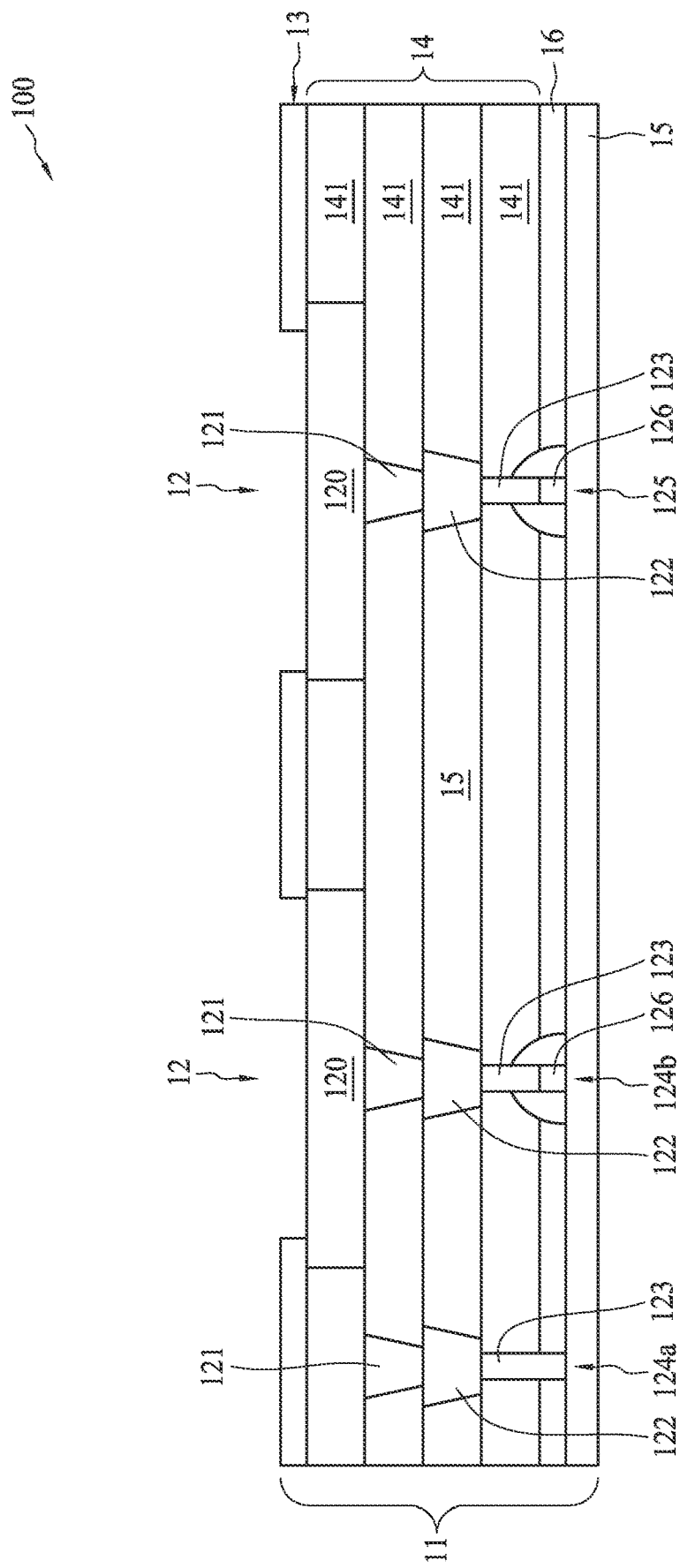
FIG. 3 is a cross-sectional view of a semiconductor device in accordance with some embodiments of the present disclosure.

FIG. 3 is a cross-sectional view of the semiconductor device for attaching to a flexible display according to aspects of the present disclosure in some embodiments. In some embodiments, the substrate 11 includes a plurality of ILD sublayers 141 formed on the base layer 15, and includes a plurality of metal interconnects 121 and 122. As shown in FIG. 3, the metal interconnects 121 and 122 are damascened into ILD sublayers 141. In some embodiments, a pre-metal dielectric (PMD) layer 16 is formed between the base layer 15 and the ILD layer 14. In some embodiments, the PMD layer 16 includes thermally grown silicon oxide. In some embodiments, the substrate 11 includes plugs 123 configured to couple metal interconnects 122 to one node 124a shown as a diffusion (e.g., n$^+$ or p$^+$) and to another node 124b shown as a gate electrode node (circuitry not shown), with 124b being a contact to a metal oxide semiconductor (MOS) gate 125 on a gate dielectric 126 on the semiconductor surface of the base layer 15. In some embodiments, the plugs 123 include tungsten, or other suitable electrically conductive plug material.

Figure 4:
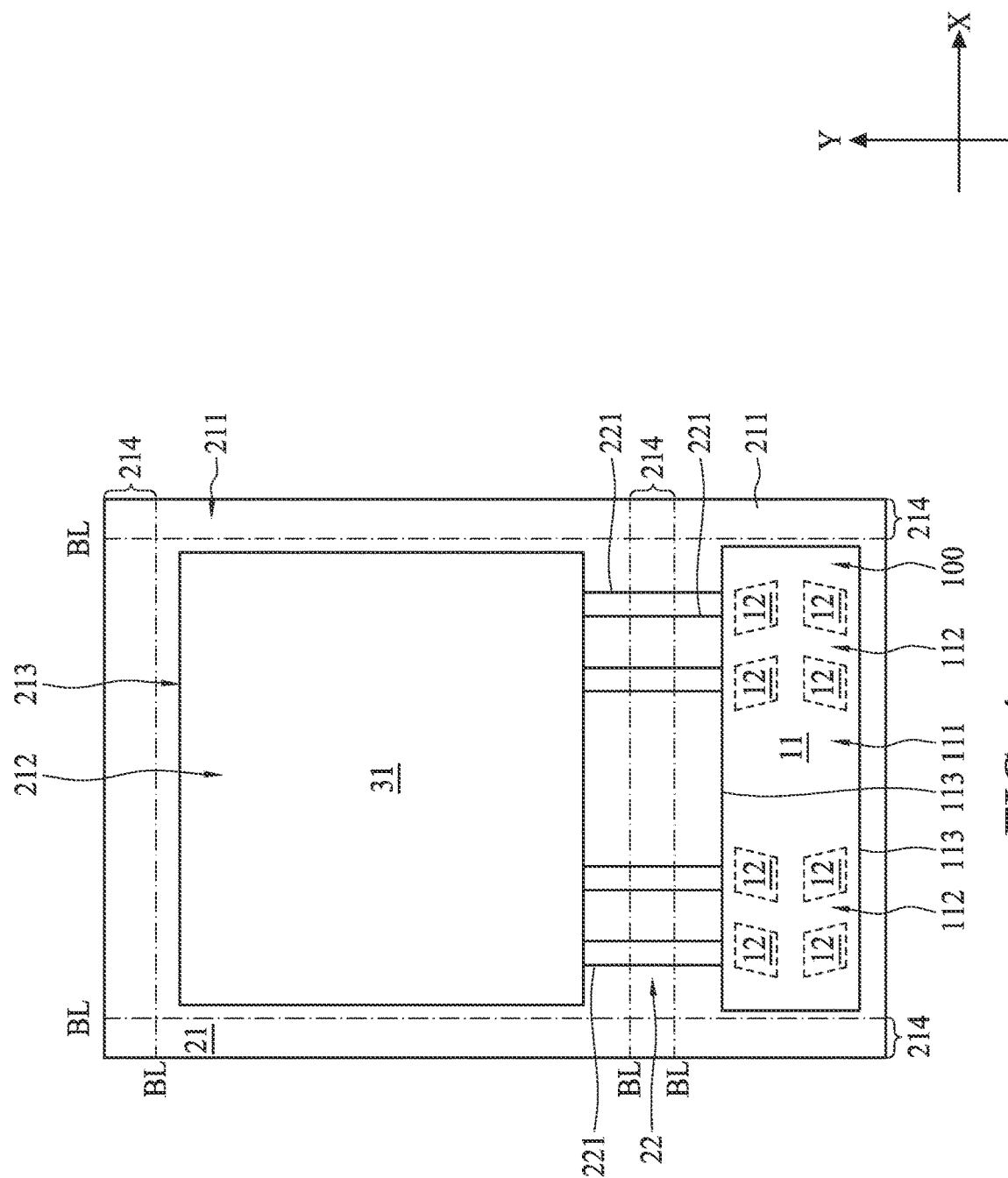
FIG. 4 is a top view of a flexible display in accordance with some embodiments of the present disclosure.
Figure 5:
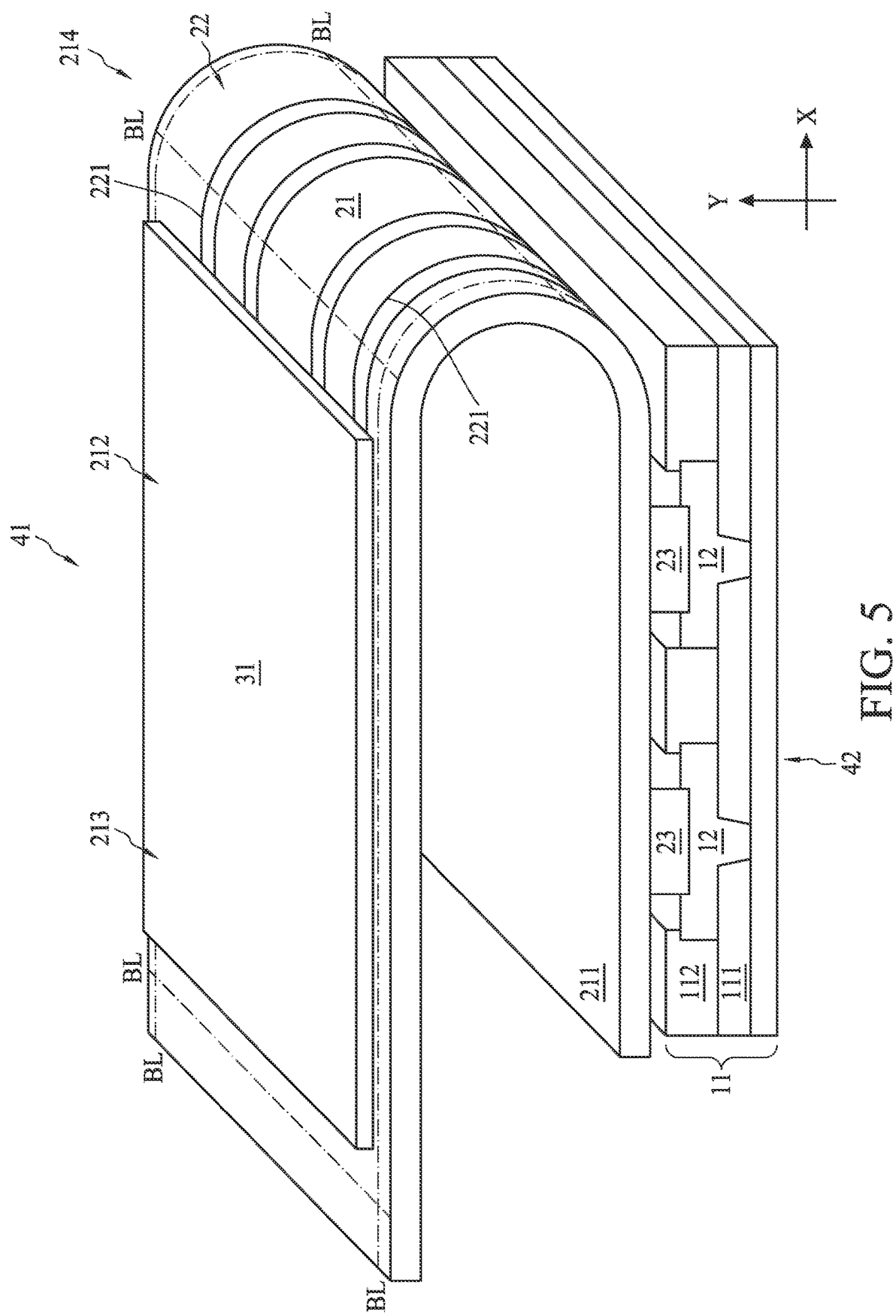
FIG. 5 is a perspective view of a flexible display in accordance with some embodiments of the present disclosure.

FIG. 4 is a top view illustrating a flexible display according to aspects of the present disclosure in some embodiments. FIG. 5 is a perspective view illustrating a flexible display according to aspects of the present disclosure in some embodiments. Referring to FIGS. 4 and 5, the flexible display includes a flexible substrate 21 including a circuit 22, and a semiconductor device 100 attached to the flexible substrate 21. The semiconductor device 100 includes a conductive pad 12 bonding to a conductor 23 of the circuit 22, and each corner of the conductive pad 12 is free of right angle. FIG. 4 shows a state in which the flexible substrate 21 is substantially flat, and FIG. 5 shows a state in which the flexible substrate 21 is bent. In some embodiments, the flexible display has a top emission configuration. Any suitable display arrangement may be used, if desired. In some embodiments, the flexible display may be incorporated in an electronic device.

In some embodiments, the semiconductor device 100 includes a plurality of conductive pads 12. In some embodiments, each conductive pad 12 is configured to output a signal to the circuit 22. In some embodiments, the circuit 22 is formed along the edge of the flexible display and is coupled to the semiconductor device 100. In some embodiments, each conductive pad 12 is bonded to a corresponding conductor 23 of the circuit 22.

In some embodiments, the flexible display includes at least one display area (i.e., active area) 212, in which an organic light-emitting diode (OLED) is formed. One or more non-display areas (i.e., inactive area) 211 may be provided at the periphery of the display area 212. That is, the non-display area 211 may be adjacent to one or more sides of the display area 212. In FIG. 4, the non-display area 211 surrounds a rectangular shape display area 212. However, it should be appreciated that the shapes of the display area 212 and the arrangement of the non-display area 211 adjacent to the display area 212 are not particularly limited to those shown in the exemplary flexible display illustrated in FIG. 4. The display area 212 and the non-display area 211 may be of any shape suitable to the design of the electronic device employing the flexible display. Non-limiting examples of the display area 212 shapes in the flexible display include a pentagonal shape, a hexagonal shape, a circular shape, an oval shape, and more.

In some embodiments, the semiconductor device 100 is attached to a non-display area 211 of the flexible substrate 21. In some embodiments, the OLED is electrically connected to a gate line and a data line to communicate with the circuit 22, which is positioned in the non-display area 211 of the flexible display 100.

In some embodiments, the flexible substrate 21 may be made of a thin plastic film. In some embodiments, the flexible substrate 21 includes polyimide (PI), polyethylene naphthalate (PEN), polyethylene terephthalate (PET), other suitable polymers, or a combination thereof. Other suitable materials that may be used to form the flexible substrate 21 include a thin glass, a metal foil covered with a dielectric material, a multi-layered polymer stack and a polymer composite film comprising a polymer material combined with nanoparticles or micro-particles dispersed therein, and combinations thereof.

In some embodiments, bending the non-display area 211 results in minimization or elimination of a view of the non-display area 211 from the front side 41 of the assembled flexible display. A part of the non-display area 211 that remains visible from the front side 41 can be covered with a bezel (not shown). The bezel may be formed, for example, from a stand-alone bezel structure that is mounted to the cover layer (not shown) formed over the OLED 31. The non-display area 211 remaining visible from the front side 41 may also be hidden under an opaque masking layer, such as black ink (e.g., a polymer filled with carbon black) or a layer of opaque metal. Such an opaque masking layer may be provided on a portion of the layers included in the flexible display.

In some embodiments, the semiconductor device 100 is coupled to a conductor 23 (e.g., in the form of pads or bumps) disposed in the non-display area 211 using chip-on-film (COF), chip-on-plastic (COP) or any other suitable technologies. As will be described in further detail below, the non-display area 211 with the conductor 23 can be bent away from the display area 212 so that the semiconductor device 100 is positioned at the rear side 42 of the flexible display to reduce the size of the non-display area 211 to be hidden by a bezel.

In some embodiments, the non-display area 211 may further include various additional components for generating a variety of signals or otherwise operating the OLED in the display area 212. In some embodiments, an inverter circuit, a multiplexer, an electrostatic discharge (ESD) circuit, or the like may be placed in the non-display area 211 of the flexible display. In some embodiments, the non-display area 211 may further include components associated with functions other than operating the OLED of the flexible display. In some embodiments, the flexible display may include components for providing a touch-sensing function, a user-authentication function (e.g., a fingerprint scan), a multi-level pressure-sensing function, a tactile-feedback function, and/or various other functions for the electronic device employing the flexible display. These components can be placed in the non-display area 211 or provided on a separate printed circuit that is connected to a connection interface of the flexible display.

Figure 6:
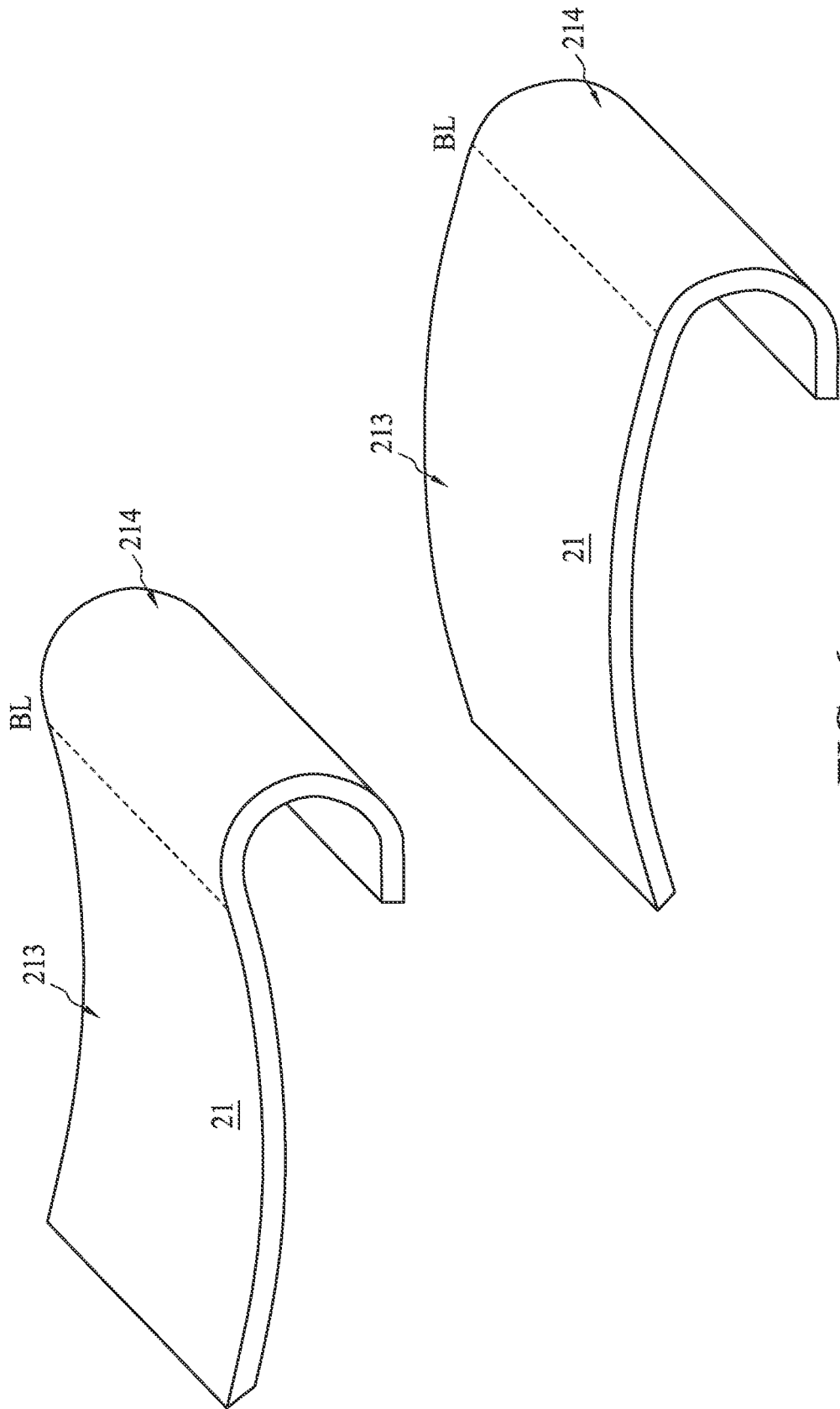
FIG. 6 shows schematic views of a flexible substrate in accordance with some embodiments of the present disclosure.

In some embodiments, parts of the flexible display may be defined by a central flat portion 213 and at least one bend portion 214. In reference to a bend line BL, the part of the flexible display 100 that remains substantially flat is referred to as the central flat portion 213, whereas the other part of the flexible display on the other side of the bend line BL is referred to as the bend portion 214. It should be noted that the central flat portion 213 of the flexible display need not be perfectly flat. While the central flat portion 213 of the flexible display is relatively more flat than the bend portion 214, the central flat portion 213 can be curved in or curved out as depicted in FIG. 6. FIG. 6 is a schematic view illustrating a flexible substrate 21 of the flexible display according to aspects of the present disclosure in some embodiments. Referring to FIGS. 4, 5 and 6, in some embodiments, one or more bend portions 214 exist next to the convex or concave central flat portion 213, and bend inwardly or outwardly along the bend line.

In some embodiments, the flexible display may be defined by a plurality of bend lines BL. In some embodiments, multiple parts of the flexible display can be bent along the bend lines BL. The bend line BL in the flexible display may extend horizontally (e.g., X-axis shown in FIG. 4), vertically (e.g., Y-axis shown in FIG. 4) or even diagonally. In some embodiments, the flexible display can be bent in any combination of horizontal, vertical and diagonal directions based on the desired design of the flexible display. In some embodiments, one or more edges of the flexible display can be bent away from the plane of the central flat portion 213 along the bend line BL. Although the bend line BL is depicted as being located near the edges of the flexible display, it should be noted that the bend lines BL can extend across the central flat portion 213 or extend diagonally at one or more corners of the flexible display.

In some embodiments, the central flat portion 213 of the flexible display 100 may be substantially flat, and one or more bend portions 214 may be bent away along the bending line BL. The size of each bend portion 214 that is bent away from the central flat portion 213 need not be the same. That is, the length of the flexible substrate 21 from the bend line BL to the outer edge of the flexible substrate 21 at each bend portion 214 can be different from other bend portions 214. Also, in some embodiments, the bend angle can vary between the bend portions 214.

As shown in FIG. 5, an organic light-emitting diode (OLED) 31 is disposed on the flexible substrate 21, and an encapsulation layer (not shown) is further disposed on the organic light-emitting diode (OLED) 31. In some embodiments, a part of the flexible substrate 21 is bent and positioned at the underside of the display area 212 as depicted in FIG. 5. In some embodiments, the semiconductor device 100 is placed at the rear side 42 of the flexible display.

In some embodiments, the circuit 22 includes a plurality of conductive lines 221. The conductive lines 221 are configured to electrically connect between various components of the flexible display, such as the semiconductor device 100 and the OLED 31. The circuit 22 fabricated in the display area 212 and the non-display area 211 may transmit various signals via one or more conductive lines 221 to provide a number of functions in the flexible display. In some embodiments, some conductive lines 221 may be used to provide connections between the circuit 22 and/or other components in the central flat portion 213 and the bend portion 214 of the flexible display. Some of the conductive lines 221 may be extended from the central flat portion 213 to the bend portion 214. In such cases, some portions of the conductive lines 221 may be configured differently from the other portions to withstand the bending stress. In particular, in some embodiments, some of the conductive lines 221 laid over the bend portion 214 may include several features for reducing cracks and fractures of the conductive lines 221 to maintain proper interconnection.

In some embodiments, the conductive lines 221 include copper, aluminum, transparent conductive oxide, or other flexible conductors. In some embodiments, the conductive lines 221 of the flexible display may have a multi-layered structure, which may allow more flexibility with less chance of breakage. In some embodiments, each conductive line 221 is electrically connected to a conductor 23.

Figure 7:
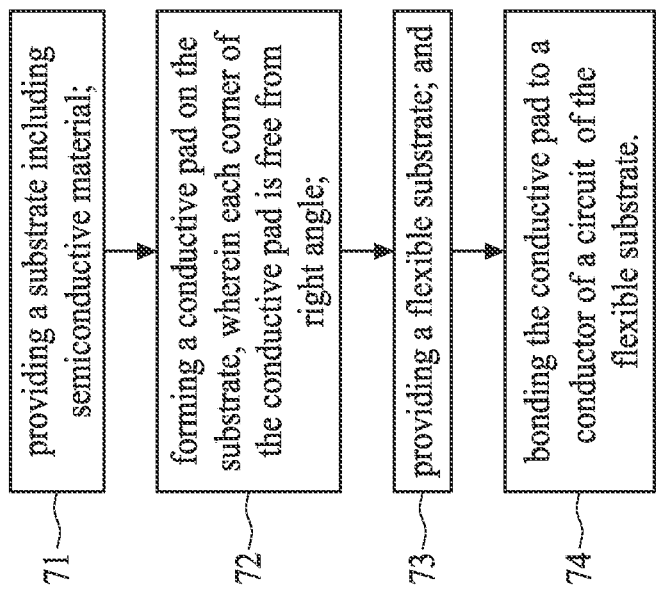
FIG. 7 is a flowchart representing a method of manufacturing a flexible display according to aspects of the present disclosure in one or more embodiments.

In the present disclosure, a method of manufacturing a flexible display is disclosed. In some embodiments, a semiconductor device is manufactured by the method. In some embodiments, a flexible display is manufactured by the method. The method includes a number of operations and the description and illustration are not deemed as a limitation of the sequence of the operations. FIG. 7 is a flowchart depicting an embodiment of the method of manufacturing the semiconductor device. The method includes operations 71, 72, 73 and 74.

FIGS. 8 to 17 are cross-sectional views and top schematic views illustrating exemplary operations for manufacturing a semiconductor device and a flexible display of the present disclosure. In some embodiments, the operations of FIGS. 8 to 15 may be used to provide or manufacture the semiconductor device similar to the semiconductor device illustrated in FIG. 2. In some embodiments, the operations of FIGS. 8 to 17 may be used to provide or manufacture the flexible display similar to the semiconductor device illustrated in FIG. 4.

Figure 8:
FIGS. 8 to 15 are cross-sectional views of a flexible display at various stages of manufacture in accordance with some embodiments of the present disclosure.

The methods begin with operation 71, in which a substrate 11 including semiconductive material is provided. In some embodiments, in operation 71, a base layer 15 is provided as shown in FIG. 8, and the base layer 15 may be patterned using photolithography techniques.

Figure 9:
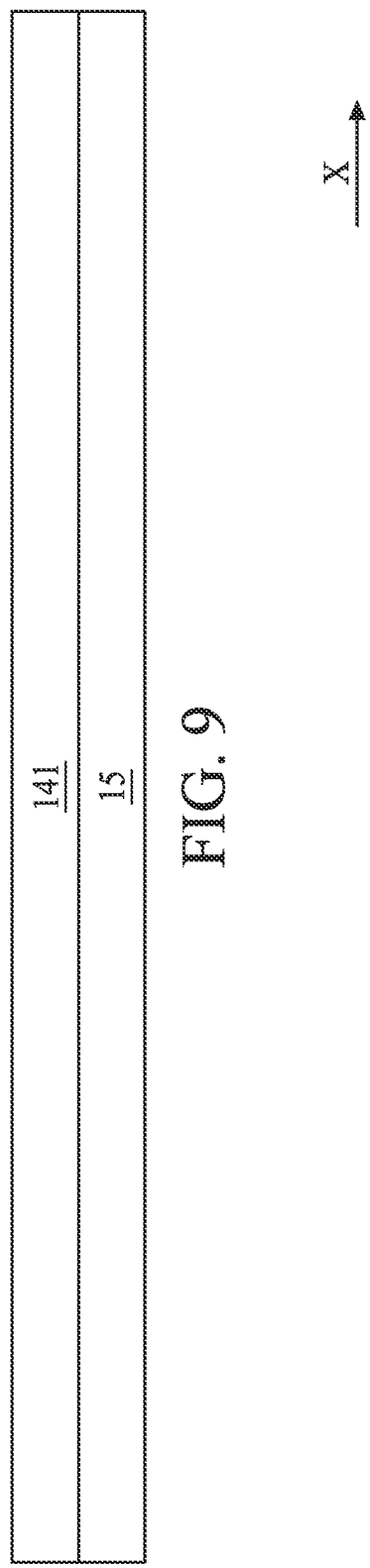

In some embodiments, an ILD layer 14 is formed over the base layer 15 extending along the first direction X. In some embodiments, an ILD sublayer 141 is formed over the base layer 15 extending along the first direction X as shown in FIG. 9. In some embodiments, the ILD layer 14 can be formed by a deposition process, such as a CVD process.

Figure 10:
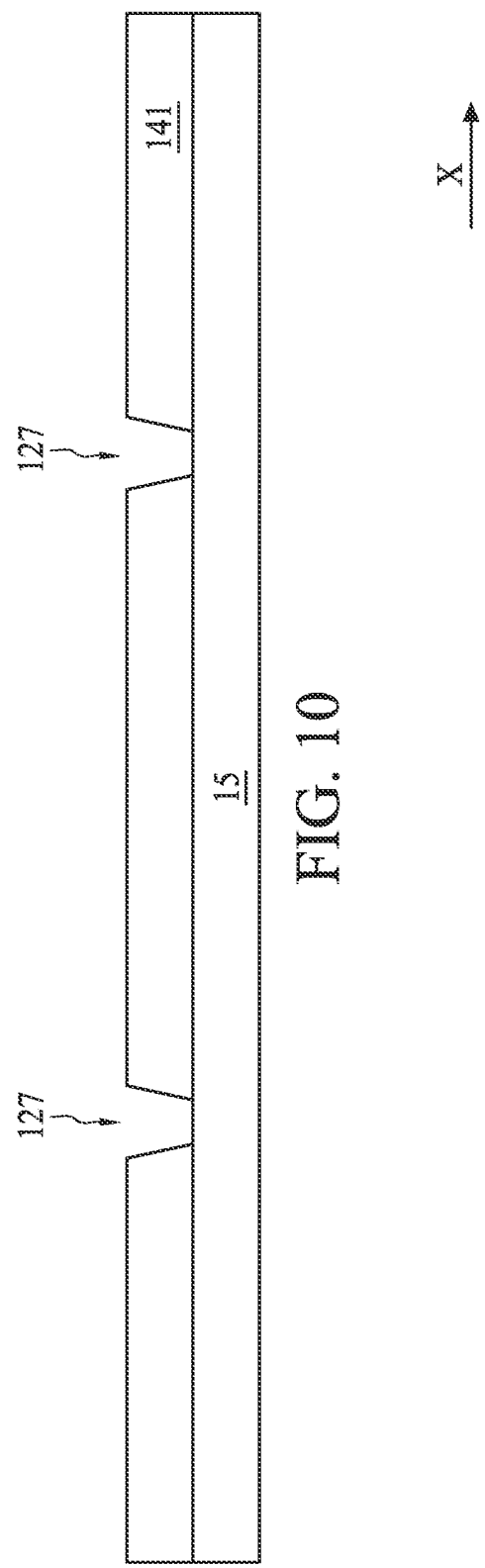

In operation 72, a conductive pad 12 is formed on the substrate 11. In some embodiments, a plurality of recesses 127 are formed in the ILD sublayer 141 as shown in FIG. 10. Each recess 127 penetrates the ILD sublayer 141. The recess 127 may be formed by removing portions of the top dielectric sublayer 141 to expose at least a portion of the underlying base layer 15.

In some embodiments, a photoresist material (not shown) is formed over the ILD sublayer 141. The photoresist material is subsequently irradiated (exposed) and developed to remove a portion of the photoresist material. Next, the exposed portions of the ILD sublayer 141 are removed using, for example, a suitable etching process to form the recesses 127.

Figure 11:
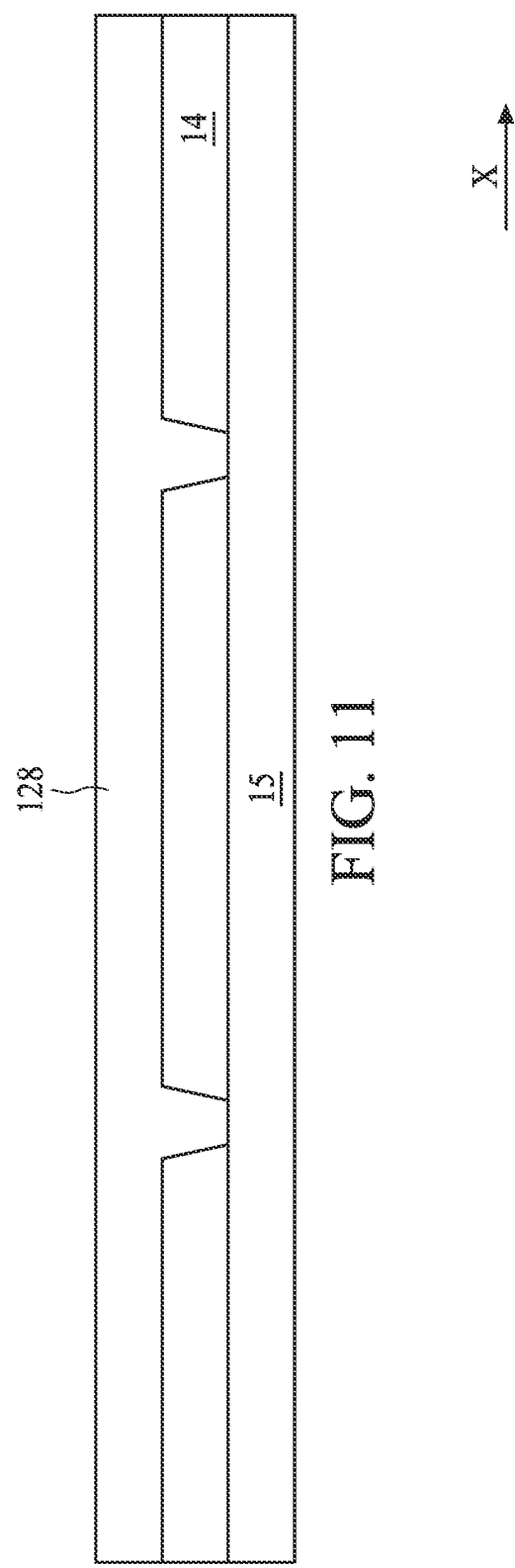

As shown in FIG. 11, recesses 127 are filled with a conductive material, thereby forming a metal interconnect layer 128 extending along the first direction X as shown in FIG. 11. The metal interconnect layer 128 may be formed using an electro-chemical plating process, an electroless plating process, PVD, ALD, the like, or a combination thereof.

Figure 12:
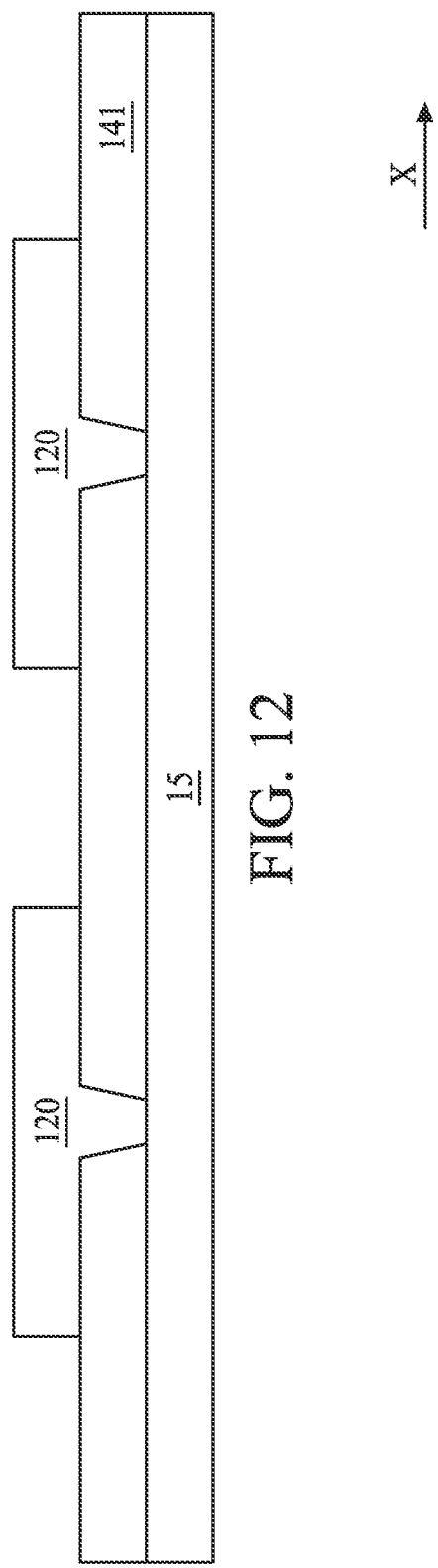

Further in operation 72, in some embodiments, the conductive features 120 are formed as shown in FIG. 12. The conductive feature 120 may be formed by first depositing a photoresist (not shown) on the metal interconnect layer 128. The photoresist may then be patterned to cover portions where the conductive features 120 are desired to be located. Once the photoresist has been formed and patterned, portions of the metal interconnect layer 128 not covered by the photoresist can be removed by a suitable etching process. Subsequently, after the removal of the photoresist, excess materials of the metal interconnect layer 128 can be removed by a CMP or the like.

Figure 13:
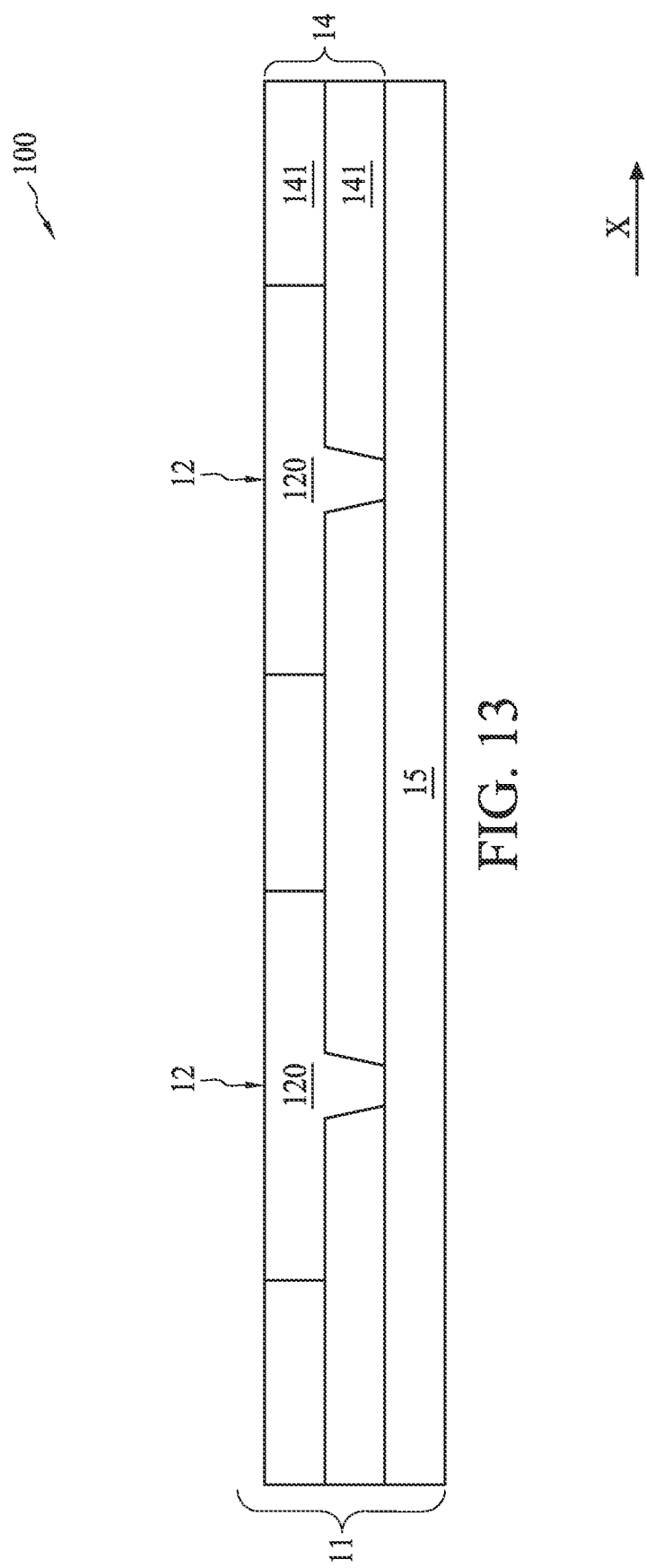

In some embodiments, additional ILD sublayers 141 are formed on the ILD sublayer 141 extending along the first direction X, wherein the additional ILD sublayers surround the conductive features 120 as shown in FIG. 13.

Figure 14:
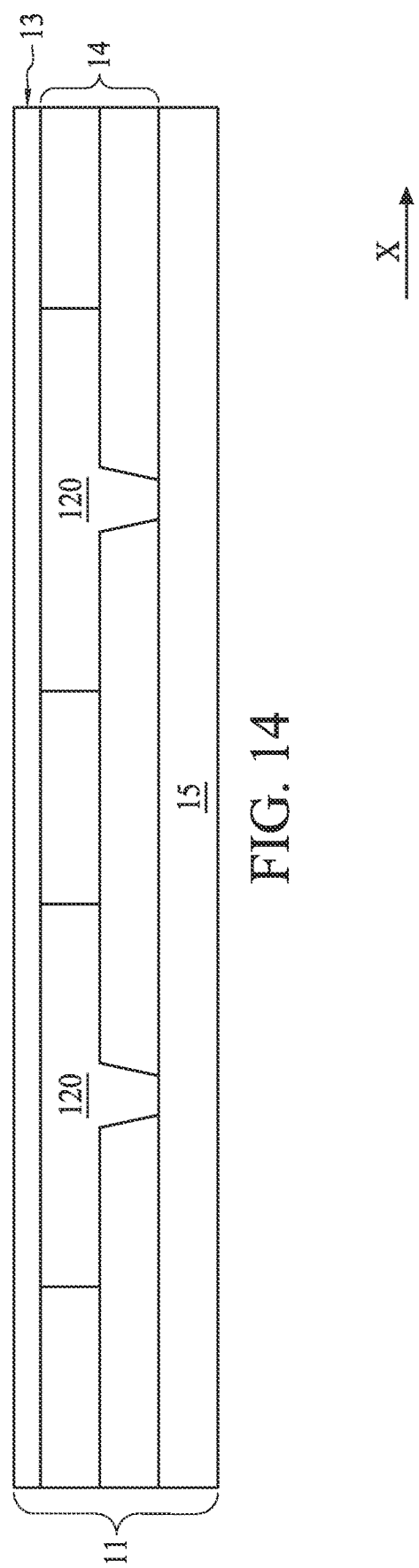

Further in operation 72, in some embodiments, a passivation layer 13 is formed over the ILD sublayer 141 and the conductive features 120, wherein the passivation layer 14 extends along the first direction X, as shown in FIG. 14.

Figure 15:
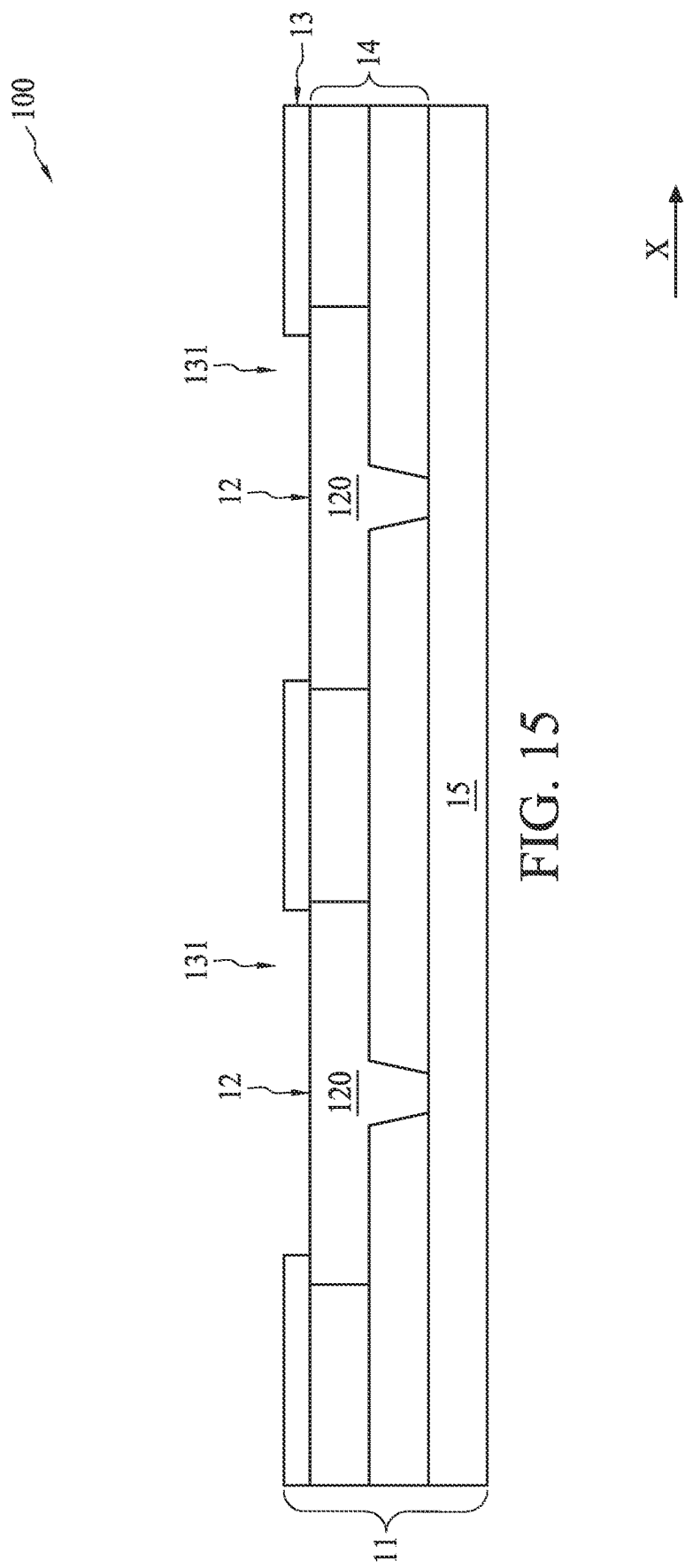

In some embodiments, recesses 131 are formed in the passivation layer 13 as shown in FIG. 15. Each recess 131 penetrates the passivation layer 13. The recesses 131 may be formed by removing portions of the passivation layer 13 to expose at least a portion of the underlying conductive features 120. Each recess 131 is free of right angle, so that the exposed portion of the conductive features 120 is free of right angle from a top view perspective. Each exposed portion of the conductive features 120 is a conductive pad 12. In some embodiments, a semiconductor device 100 is thus formed.

In some embodiments, a photoresist material (not shown) is formed over the top of the passivation layer 13. The photoresist material is subsequently irradiated (exposed) and developed to remove a portion of the photoresist material. Next, the exposed portions of the passivation layer 13 are removed using, for example, a suitable etching process to form the recesses 131.

Figure 16:
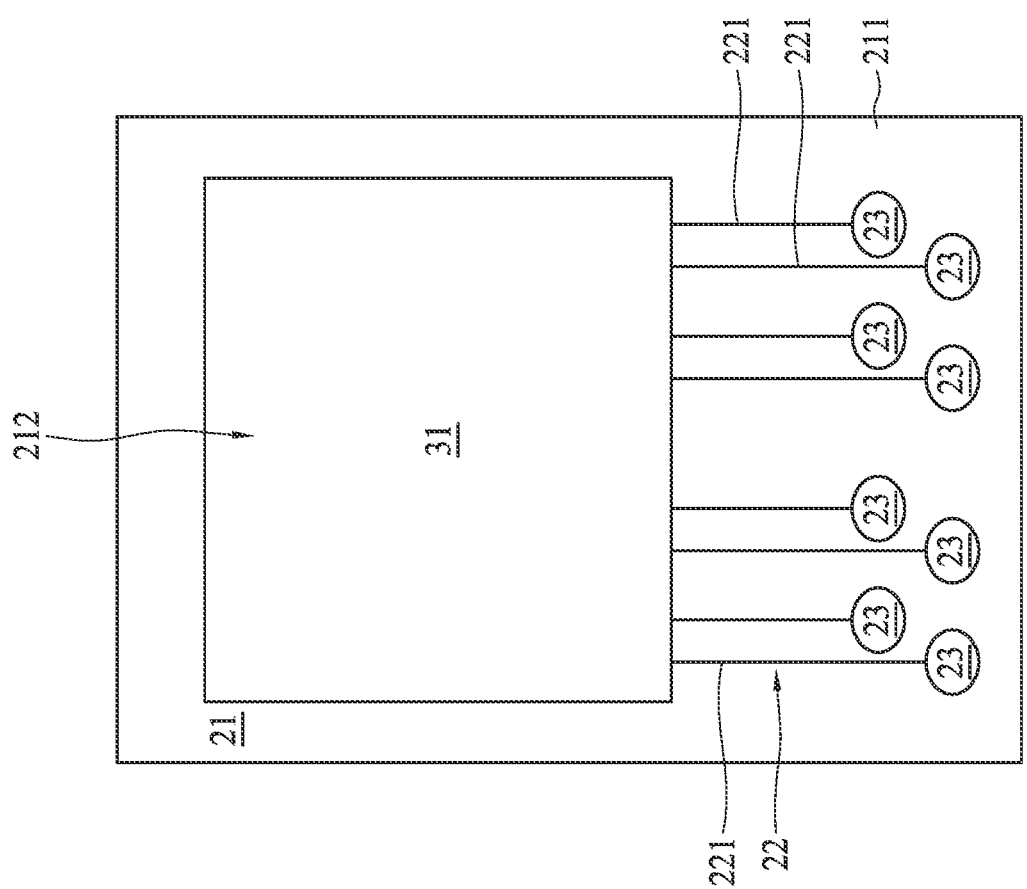
FIGS. 16 and 17 are top schematic views of a flexible display at various stages of manufacture in accordance with some embodiments of the present disclosure.

In operation 73, a flexible substrate 21 is provided. As shown in FIG. 16, the flexible substrate 21 includes a circuit 22. The flexible substrate 21 further includes a non-display area 211. In some embodiments, an organic light-emitting diode (OLED) 31 is formed over the flexible substrate 21. In some embodiments, the OLED 31 is located in a display area 212 of the flexible substrate 21. In some embodiments, the circuit 22 includes a plurality of conductive lines 221. In some embodiments, each conductive line 221 is electrically connected to a conductor 23.

Figure 17:
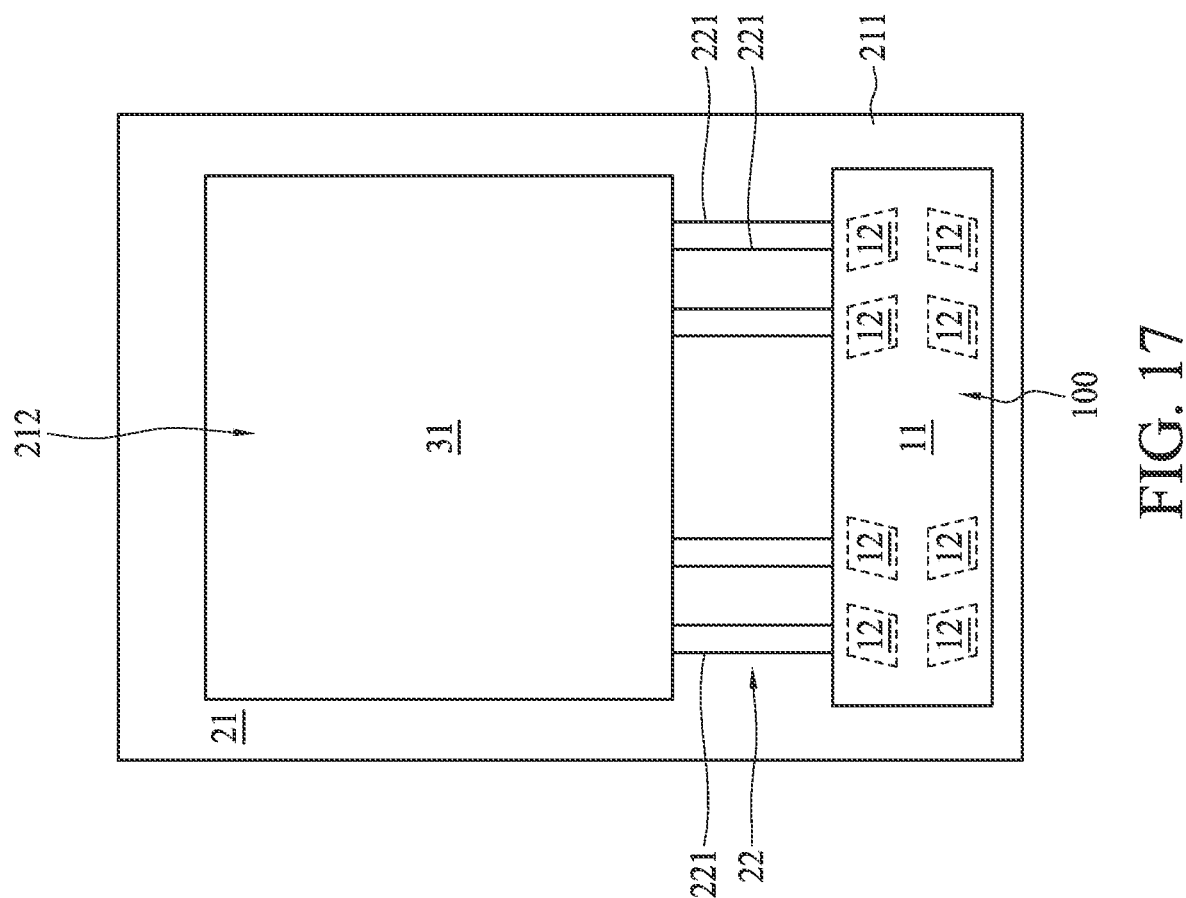

In operation 74, the conductive pads 12 of the semiconductor device 100 are bonded to the corresponding conductors 23 of the circuit 22. In some embodiments, as shown in FIG. 17, the semiconductor device 100 is attached to the flexible substrate 21. In some embodiments, the semiconductor device 100 is attached to the flexible substrate 21 by applying a predetermined pressure to the semiconductor device 100. In some embodiments, the semiconductor device 100 is attached to a non-display area 211 of the flexible substrate 21. In some embodiments, the conductive pad 12 is located between the substrate 11 and the flexible substrate 21.

Accordingly, the present disclosure provides a semiconductor device for attaching to a flexible display, a flexible display, and a method of manufacturing a flexible display. The semiconductor device includes a conductive pad that is free of right angle from a top view perspective. Consequently, when the semiconductor device is bonded or attached to the flexible display, the semiconductor device is not susceptible to cracking.

In some embodiments, a semiconductor device for attaching to a flexible display is provided. The semiconductor device includes a substrate including semiconductive material, and a conductive pad disposed on the substrate. Each corner of the conductive pad is free of right angle.

In some embodiments, a flexible display is provided. The flexible display includes a flexible substrate including a circuit, and a semiconductor device attached to the flexible substrate. The semiconductor device includes a substrate including semiconductive material, and a conductive pad disposed on the substrate. Each corner of the conductive pad is free of right angle.

In some embodiments, a method of manufacturing a flexible display is provided. The method of manufacturing a flexible display includes providing a substrate including semiconductive material, and forming a conductive pad on the substrate, wherein each corner of the conductive pad is free of right angle. The method further includes providing a flexible substrate, and bonding the conductive pad to a conductor of a circuit of the flexible substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device for attaching to a flexible display, comprising:
    a substrate including a first area and a second area having a higher pad density than the first area;
    a plurality of conductive features disposed on the substrate; and
    a passivation layer disposed over the plurality of conductive features to define a plurality of conductive pads in the respective plurality of conductive features through exposed portions of each of the plurality of conductive features,
    wherein the substrate has a pair of long sides, each of the plurality of conductive pads is a parallelogram and has a pair of long sides and a pair of short sides, a portion of the plurality of conductive pads have the long sides sloped away from the first area and toward one long side of the substrate, and the rest of the plurality of conductive pads have the long sides sloped toward the first area and toward the other long side of the substrate.

2. The semiconductor device of claim 1, wherein the passivation layer provides trenches to expose portions of the plurality of conductive features.

3. The semiconductor device of claim 1, wherein the short sides of each of the plurality of conductive pads are parallel to the long sides of the substrate.

4. The semiconductor device of claim 1, wherein the first area is located at the center of the substrate.

5. The semiconductor device of claim 1, wherein the substrate further includes at least two second area, and the first area is located between the second areas.

6. The semiconductor device of claim 1, wherein each corner of each of the plurality of conductive pads is free of right angle.

7. The semiconductor device of claim 4, wherein the passivation layer includes silicon nitride (SiN), silicon carbide (SiC), silicon oxide (SiO), and/or silicon oxynitride (SiON).

8. The semiconductor device of claim 1, wherein the semiconductive material includes silicon, silicon-germanium, or other semiconductor materials including III-V or II-VI materials.

9. A flexible display, comprising:
a flexible substrate including a circuit, and
a semiconductor device attached to the flexible substrate;
wherein the semiconductor device includes:
an interlayer dielectric layer including a first area and a second area having a higher pad density than the first; and
a plurality of conductive features surrounded by the interlayer dielectric layer and bonded to the circuit,
a passivation layer disposed over the interlayer dielectric layer and the conductive features;
wherein the passivation layer defines a plurality of conductive pads in the respective plurality of conductive features through exposed portions of each of the plurality of conductive features, the interlayer dielectric layer has a pair of long sides, each of the plurality of conductive pads is a parallelogram and has a pair of long sides and a pair of short sides, a portion of the plurality of conductive pads have the long sides sloped away from the first area and toward one long side of the interlayer dielectric layer, and the rest of the plurality of conductive pads have the long sides sloped toward the first area and toward the other long side of the interlayer dielectric layer.

10. The flexible display of claim 9, wherein the flexible substrate includes polyimide.

11. The flexible display of claim 9, wherein the semiconductor device is attached to a non-display area of the flexible substrate.

12. The flexible display of claim 9, wherein plurality of conductive features are bonded a conductor of the circuit, and the conductor is located at a non-display area of the flexible substrate.

13. The flexible display of claim 9, further including an organic light-emitting diode formed over the flexible substrate.

14. The flexible display of claim 13, wherein the organic light-emitting diode is located at a display area of the flexible substrate.

15. The flexible display of claim 13, wherein the organic light-emitting diode is located at a central flat portion of the flexible substrate.

16. The flexible display of claim 13, wherein the circuit includes a plurality of conductive lines electrically connected between the semiconductor device and organic light-emitting diode.

17. The flexible display of claim 9, wherein the semiconductor device is positioned at the rear side of the flexible display.

18. A semiconductor device for attaching to a flexible display, comprising:
a substrate including an interlayer dielectric layer and a passivation layer over the interlayer dielectric layer; wherein the substrate includes a first area and a second area having a higher pad density than the first area from a top view perspective;
a plurality of conductive features surrounded by the interlayer dielectric layer;
wherein the passivation layer is disposed over the plurality of conductive features, the passivation layer defines a plurality of conductive pads in the respective plurality of conductive features through exposed portions of each of the plurality of conductive features, each of the plurality of conductive pads are disposed on the second area, and each of the plurality of conductive pads is a parallelogram, part of the plurality of conductive pads is slanted away from the first area, and the other part of the plurality of conductive pads is slanted toward the first area.

19. The semiconductor device of claim 18, wherein the substrate further includes a base layer, and the interlayer dielectric layer is formed on the base layer.

20. The semiconductor device of claim 19, wherein the substrate further includes a pre-metal dielectric layer between the base layer and the interlayer dielectric layer.

* * * * *